US012660103B2

(12) United States Patent

Kim et al.

(10) Patent No.: US 12,660,103 B2

(45) Date of Patent: Jun. 16, 2026

(54) DISPLAY DEVICE

(71) Applicant: Samsung Display Co., LTD., Yongin-si (KR)

(72) Inventors: Tae-Chang Kim, Anyang-si (KR); Taehoon Yang, Yongin-si (KR); Chanhui Han, Seongnam-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 357 days.

(21) Appl. No.: 18/310,606

(22) Filed: May 2, 2023

(65) Prior Publication Data

US 2024/0032220 A1     Jan. 25, 2024

(30) Foreign Application Priority Data

Jul. 21, 2022     (KR) ........................ 10-2022-0090307

(51) Int. Cl.
H05K 5/02 (2006.01)

(52) U.S. Cl.
CPC .................................. H05K 5/0217 (2013.01)

(58) Field of Classification Search
CPC .... H05K 5/0217; G06F 1/1652; G06F 1/1624
See application file for complete search history.

(56) References Cited

U.S. PATENT DOCUMENTS

| | | | | | |
|---|---|---|---|---|---|
| 10,820,433 | B2 * | 10/2020 | Cha | ...................... | H05K 5/0226 |
| 11,003,219 | B1 * | 5/2021 | Kim | ...................... | G06F 1/1652 |
| 11,012,546 | B1 * | 5/2021 | Song | ...................... | G06F 1/1656 |
| 11,416,035 | B2 * | 8/2022 | Lee | ...................... | G06F 1/1681 |
| 11,497,130 | B2 * | 11/2022 | Song | ...................... | G06F 1/1652 |
| 2013/0058063 | A1 * | 3/2013 | O'Brien | ............... | G06F 1/1624 |
| | | | | | 361/807 |
| 2020/0319672 | A1 * | 10/2020 | Kim | ...................... | G06F 1/1656 |
| 2020/0363841 | A1 * | 11/2020 | Kim | ...................... | G09F 9/301 |
| 2021/0044683 | A1 * | 2/2021 | He | ...................... | G06F 1/1652 |
| 2022/0078270 | A1 * | 3/2022 | Song | ...................... | H04M 1/0235 |
| 2022/0201880 | A1 * | 6/2022 | Choi | ...................... | H05K 5/0217 |
| 2022/0253103 | A1 * | 8/2022 | Choi | ...................... | G06F 1/1624 |
| 2022/0413548 | A1 * | 12/2022 | Sun | ...................... | G06F 1/1616 |

FOREIGN PATENT DOCUMENTS

| | | |
|---|---|---|
| KR | 10-2021-0083442 | 7/2021 |
| KR | 10-2306982 | 10/2021 |
| KR | 10-2022-0008732 | 1/2022 |
| KR | 10-2022-0030864 | 3/2022 |

\* cited by examiner

*Primary Examiner* — Sagar Shrestha

(74) *Attorney, Agent, or Firm* — F. CHAU & ASSOCIATES, LLC

(57) ABSTRACT

A display device includes: a display module including a first area and a second area positioned adjacent to the first area, the second area including a portion curved to have a constant curvature, a plate including: a first plate disposed under the display module and overlapping the first area and a second plate disposed under the display module and overlapping the second area and extending from the first plate, segmental members disposed under the plate and overlapping the second area, and guide members overlapping the segmental members in the second area and movable under the segmental members.

22 Claims, 12 Drawing Sheets

F I G . 14
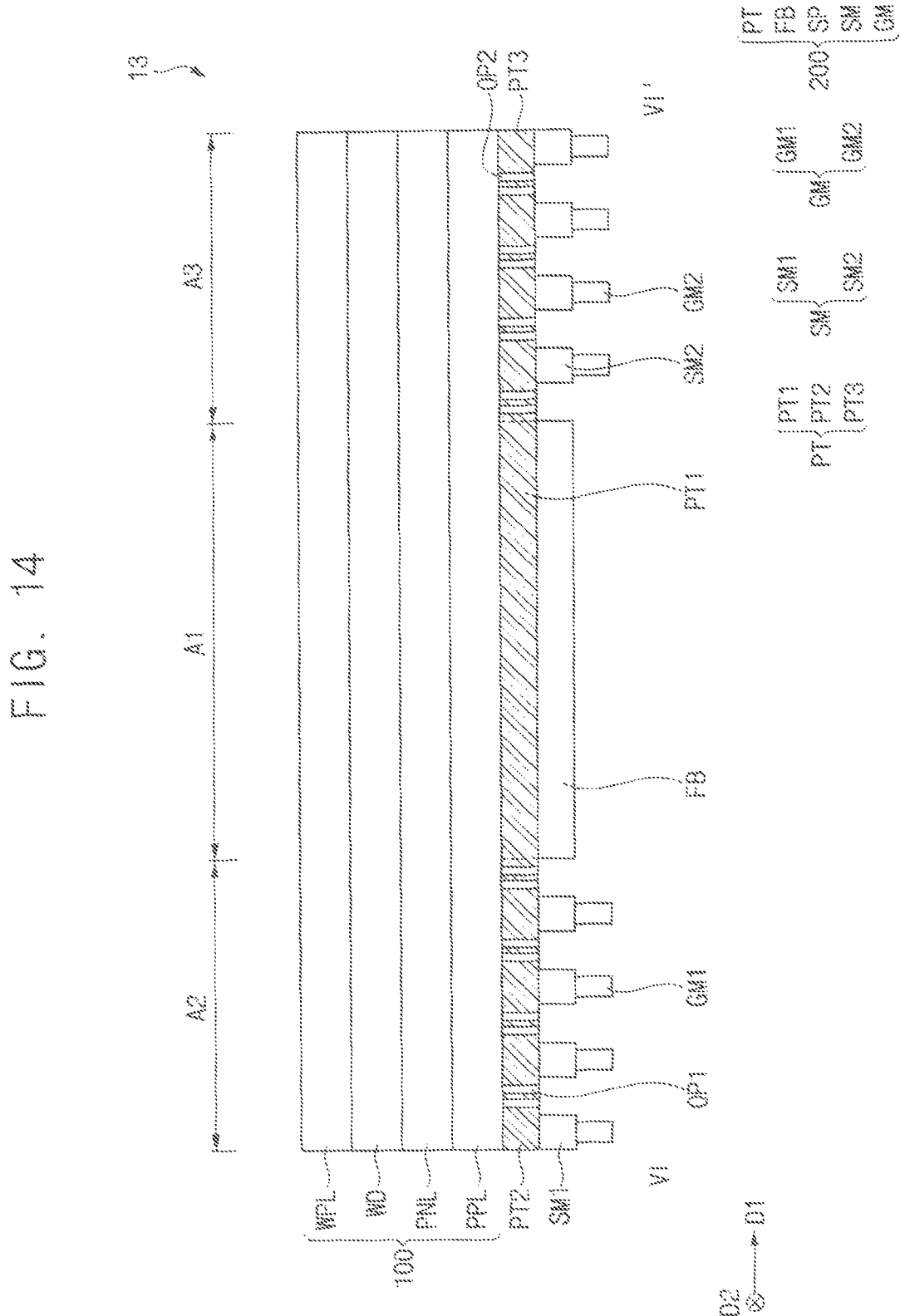

DISPLAY DEVICE

CROSS-REFERENCE TO RELATED APPLICATION(S)

This application claims priority to and benefits of Korean Patent Application No. 10-2022-0090307 under 35 U.S.C. § 119, filed on Jul. 21, 2022, in the Korean Intellectual Property Office, the entire contents of which are incorporated hereby by reference.

BACKGROUND

1. Technical Field

Embodiments relate to a display device providing visual information.

2. Description of the Related Art

With the development of information technology, the importance of a display device, which is a connection medium between a user and information, has been highlighted. For example, the use of a display device such as a liquid crystal display device ("LCD"), an organic light emitting display device ("OLED"), a plasma display device ("PDP"), a quantum dot display device, and the like is increasing.

Recently, a flexible display device, which is bendable, is in demand. For example, a flexible display device such as a foldable display device or a slidable display device is being used.

SUMMARY

Embodiments provide a display device capable of improving reliability and performing a sliding operation.

However, embodiments of the disclosure are not limited to those set forth herein. The above and other embodiments will become more apparent to one of ordinary skill in the art to which the disclosure pertains by referencing the detailed description of the disclosure given below.

A display device according to embodiments may include a display module including a first area and a second area positioned adjacent to the first area, the second area including a portion curved to have a constant curvature, a plate including: a first plate disposed under the display module and overlapping the first area and a second plate disposed under the display module and overlapping the second area, the second plate extending from the first plate, segmental members disposed under the plate and overlapping the second area, and guide members overlapping the segmental members in the second area and movable under the segmental members.

In an embodiment, end portions of each of the guide members may have a protruding shape in a cross-section.

In an embodiment, each of the guide members may have an omega (Ω) shape or a T shape in a cross-section.

In an embodiment, the display device may further include a support plate disposed under the segmental members and movable under the segmental members.

In an embodiment, the support plate may have a rectangular shape with a side opening in a plan view.

In an embodiment, the support plate may be plural.

In an embodiment, the support plate partially may overlap the second area in case that the support plate is positioned in the first area.

In an embodiment, the segmental members may be spaced apart from each other in a first direction, and each of the segmental members may extend in a second direction perpendicular to the first direction.

In an embodiment, the support plate may overlap the guide members in the second direction.

In an embodiment, the guide members may be spaced apart from each other in the first direction.

In an embodiment, the display device may further include a pair of rails disposed between the segmental members and the support plate, and directly contacting each of the support plate and the guide members.

In an embodiment, the guide member may be spaced apart from each other in a direction and each of the pair of rails may extend in the direction.

In an embodiment, the display device may further include a bearing disposed between the guide members and directly contacting the pair of rails.

In an embodiment, the bearing may have a circular shape in a cross-section.

In an embodiment, the bearing may include stainless steel (SUS).

In an embodiment, a width of each of the guide members may be smaller than a width of each of the segmental members.

In an embodiment, the second plate may include a plurality of openings spaced apart from each other by substantially constant distances.

In an embodiment, the segmental members may directly contact the second plate and do not overlap the plurality of openings.

A display device according to embodiments may include a display module including a first area and a second area positioned adjacent to the first area in a first direction, the second area including a portion curved to have a substantially constant curvature, a plate including: a first plate disposed under the display module and overlapping the first area and a second plate disposed under the display module and overlapping the second area, the second plate extending from the first plate, a flat bar disposed under the first plate and overlapping the first area, segmental members disposed under the second plate and overlapping the second area, and guide members overlapping the segmental members in the second area and movable in the first direction under the segmental members.

In an embodiment, each of the guide members may have an omega (Ω) shape or a T shape in a cross-section.

In an embodiment, the display device may further include a support plate disposed under the segmental members and movable in the first direction under the segmental members.

In an embodiment, the support plate may have a rectangular shape with a side opening in a plan view.

In an embodiment, the support plate may include a plurality of support plates and the plurality of support plates may be spaced apart from each other in a second direction perpendicular to the first direction.

In an embodiment, the segmental members may be spaced apart from each other in the first direction, and each of the segmental members may extend in a second direction perpendicular to the first direction.

In an embodiment, the support plate may overlap the guide members in the second direction.

In a display device according to an embodiment, the display device may include a display module including a first area and a second area positioned adjacent to the first area, the second area including a portion curved to have a constant curvature, a plate including: a first plate disposed under the display module and overlapping the first area and a second plate disposed under the display module and overlapping the second area, the second plate extending from the first plate, segmental members disposed under the plate and overlapping the second area, and guide members overlapping the segmental members in the second area and movable under the segmental members. Accordingly, lifting of the segmental members due to the guide members may be prevented in case that the display device is slid.

In a display device according to an embodiment, the display device may further include a support plate movable under the segmental members. Accordingly, in case that the display device is slid, the segmental members may be prevented from sagging or bending due to the support plate.

BRIEF DESCRIPTION OF THE DRAWINGS

Illustrative, non-limiting embodiments will be more clearly understood from the following detailed description in conjunction with the accompanying drawings.

FIG. 14 is a schematic cross-sectional view taken along line VI-VI' of FIG. 12.

DETAILED DESCRIPTION OF THE EMBODIMENTS

Figure 1:
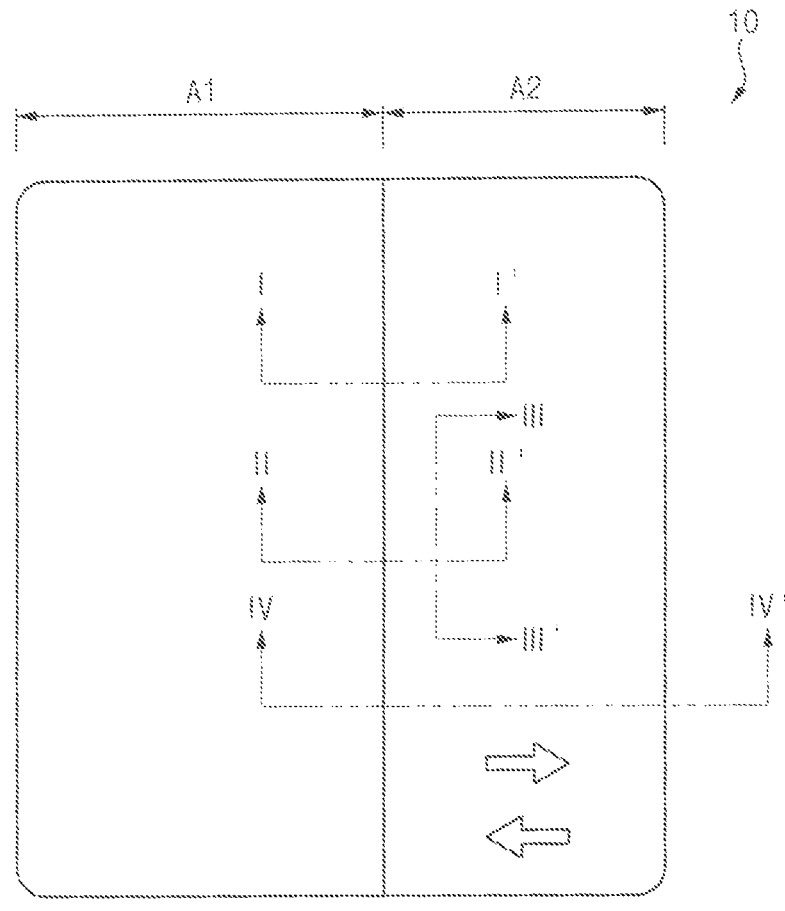
FIG. 1 is a schematic plan view illustrating a display device according to an embodiment.
Figure 1:
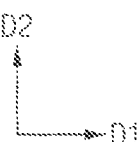

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the invention.

Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the invention.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the X, Y, and Z-axes, and may be interpreted in a broader sense. For example, the D1-axis, the D2-axis, and the D3-axis may be perpendicular to one another, or may represent different directions that are not perpendicular to one another. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of A and B" may be construed as understood to mean A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Hereinafter, a display device according to embodiments will be explained in detail with reference to the accompanying drawings. The same reference numerals are used for the same components in the drawings, and redundant descriptions of the same components will be omitted.

FIG. 1 is a schematic plan view illustrating a display device according to an embodiment.

Referring to FIG. 1, a display device 10 according to an embodiment may include a first area A1 and a second area A2. The second area A2 may be positioned adjacent to the first area A1. For example, the second area A2 may be positioned adjacent to the first area A1 in a first direction D1.

Each of the first area A1 and the second area A2 may be a display area for displaying an image. However, embodiments are not limited thereto, and each of the first area A1 and the second area A2 may partially display an image.

The display device 10 may be a slidable display device that adjusts an area for displaying an image through sliding. In case that the display device 10 is unfolded, the display area may be expanded, and in case that the display device 10 is rolled, the display area may be reduced.

The first area A1 may be an area exposed to the outside of the display device 10 and may have a flat shape. The first area A1 may be rigid. The second area A2 may be flexible, may have a changeable shape, and may be exposed to the outside of the display device 10 or accommodated inside the display device 10 as the display device 10 is slid. In case that the second area A2 is exposed to the outside, the second area A2 may have a flat shape. In case that the second area A2 is accommodated inside, the second area A2 may have a curved shape.

Figure 7:
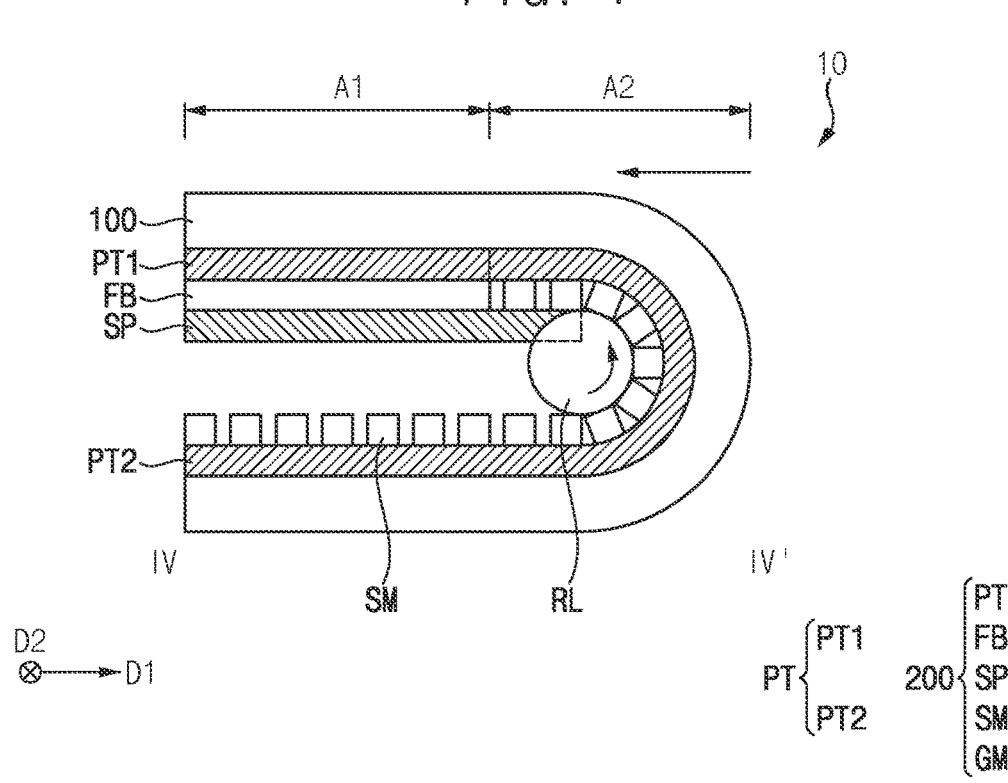
FIG. 7 is a schematic cross-sectional view taken along line IV-IV' of FIG. 1.
Figure 8:
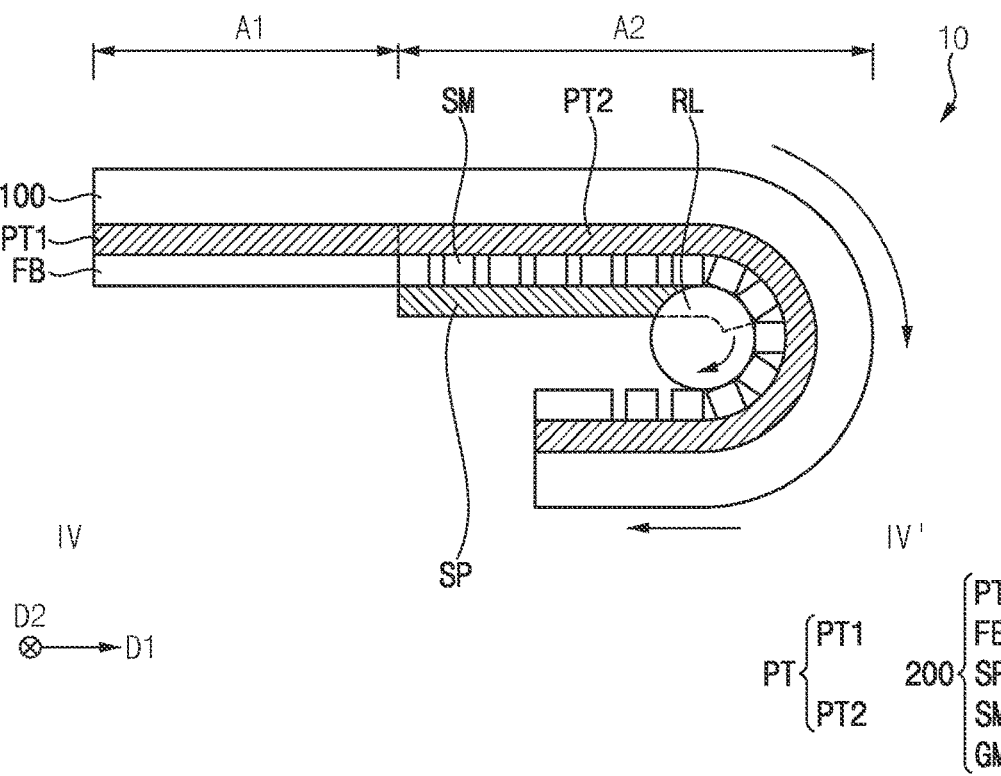
FIG. 8 is a schematic cross-sectional view illustrating the display device of FIG. 7 in an unfolded state.

In case that the display device 10 is slid, the area (or size) of the second area A2 may change. Referring to FIG. 8, in case that the display device 10 is slid and unfolded, the area (or size) of the second area A2 may increase. Referring to FIG. 7, in case that the display device 10 is slid and wound, the area (or size) of the second area A2 may decrease.

In a plan view, the first direction D1 may be parallel to a first side of the display device 10, and the second direction D2 may be parallel to a second side of the display device 10. The second direction D2 may be perpendicular to the first direction D1. For example, in a plan view, the first direction D1 may be a horizontal direction of the display device 10, and the second direction D2 may be a vertical direction of the display device 10.

Figure 2:
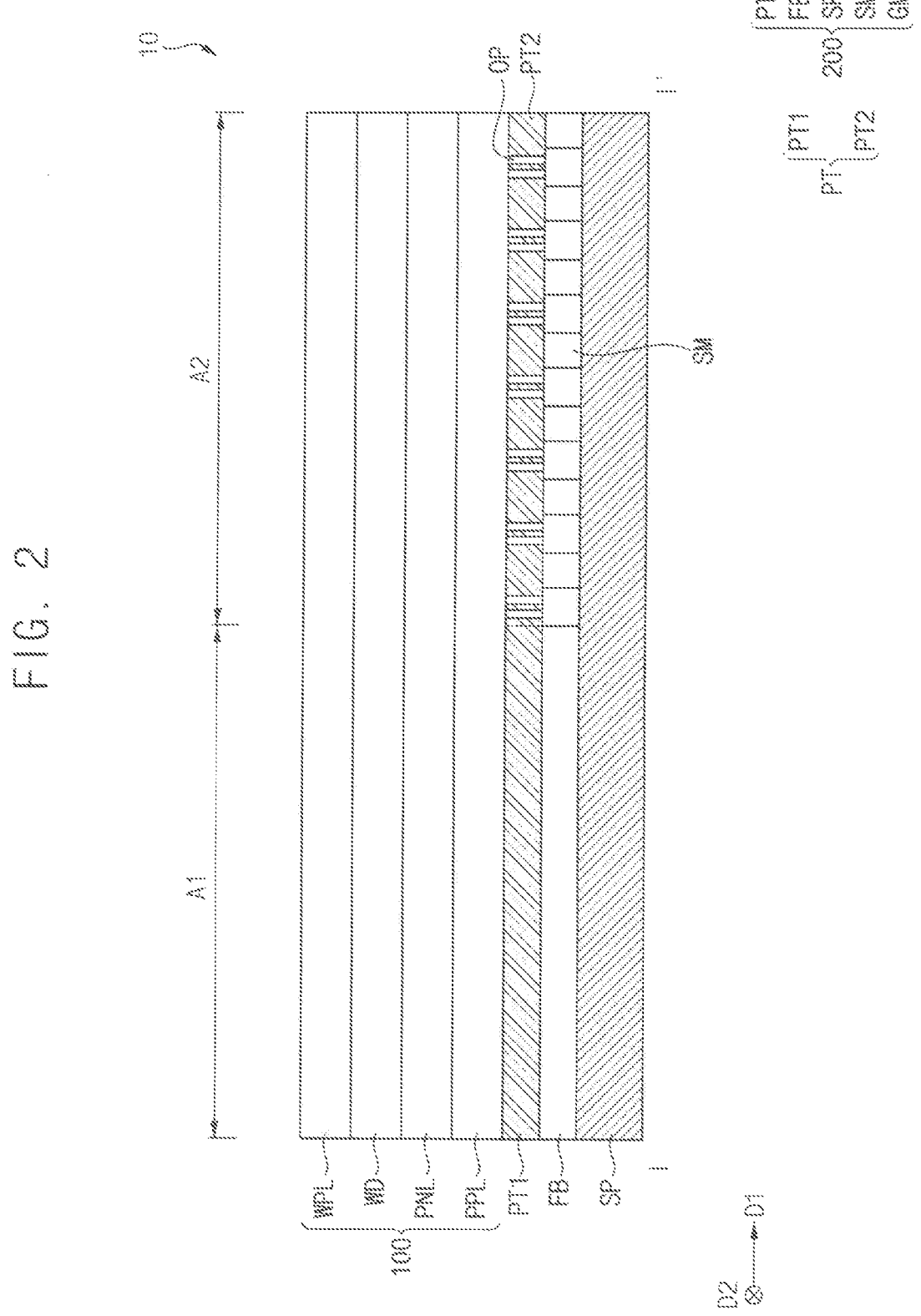
FIG. 2 is a schematic cross-sectional view taken along line I-I' of FIG. 1.
Figure 3:
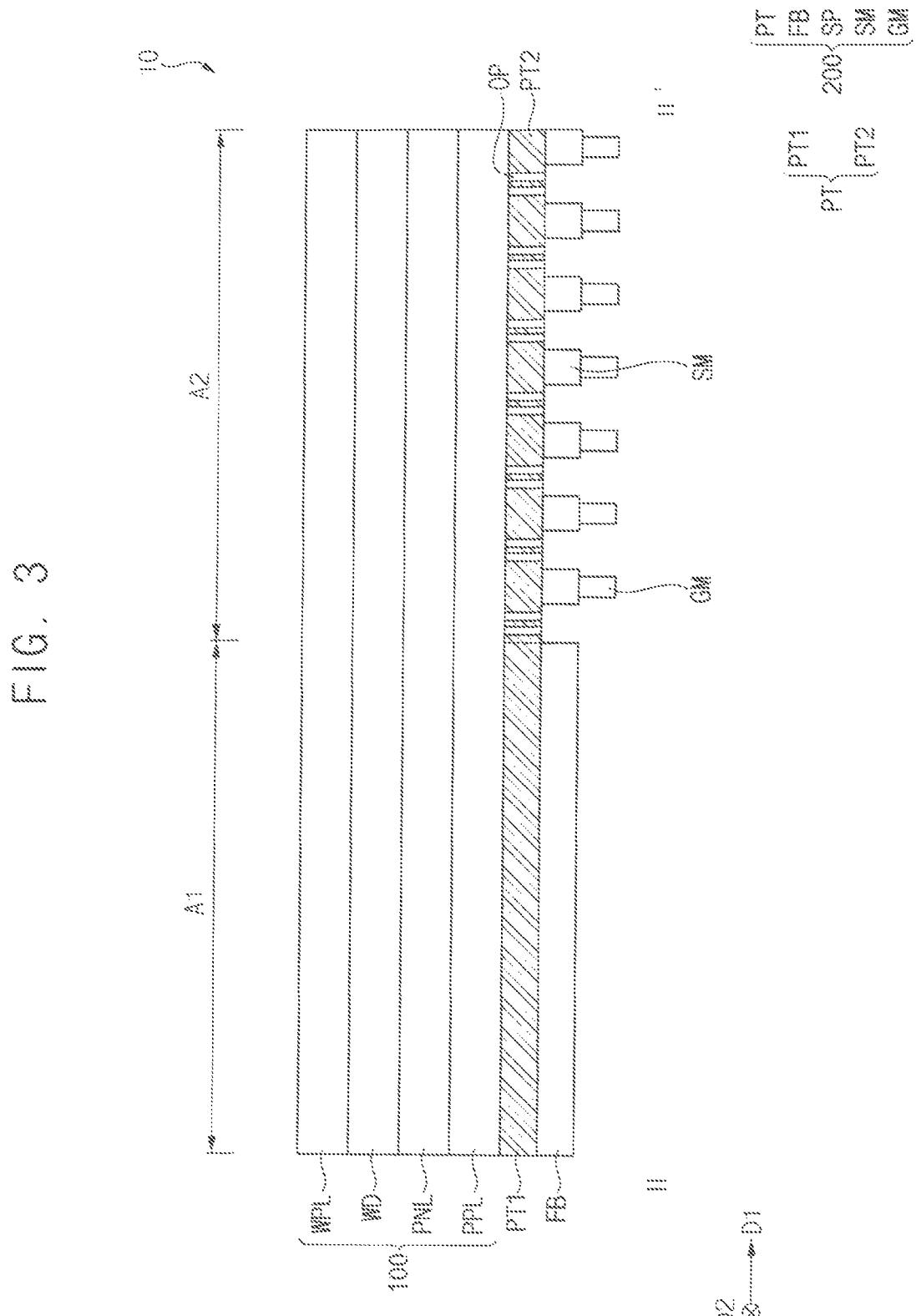
FIG. 3 is a schematic cross-sectional view taken along line II-Ir of FIG. 1.
Figure 4:
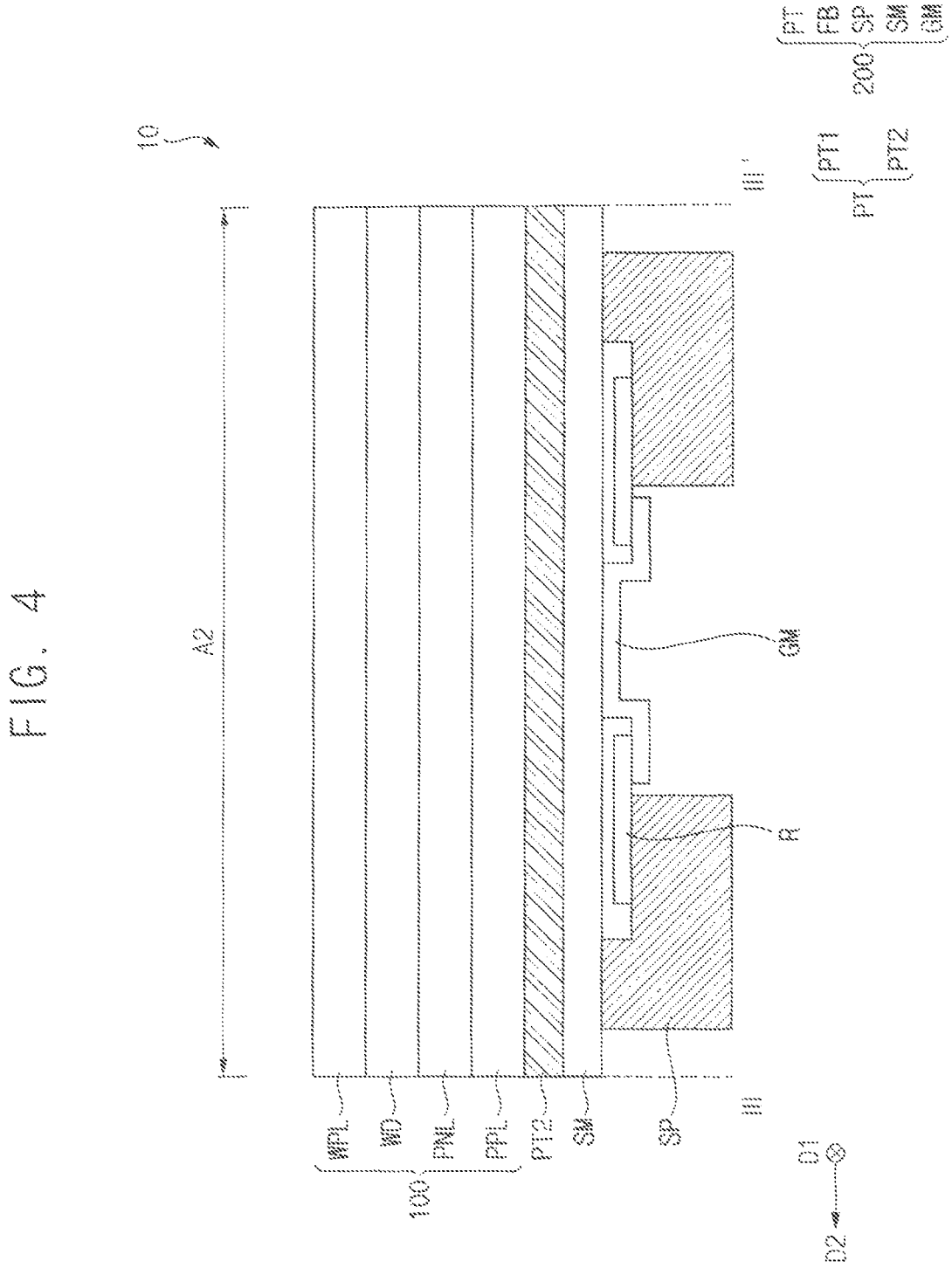
FIG. 4 is a schematic cross-sectional view taken along line of FIG. 1.

FIG. 2 is a schematic cross-sectional view taken along line I-I' of FIG. 1. FIG. 3 is a schematic cross-sectional view taken along line II-II' of FIG. 1. FIG. 4 is a schematic cross-sectional view taken along line of FIG. 1.

Referring to FIGS. 1, 2, 3, and 4, the display device 10 according to an embodiment may include a display module 100 and a lower structure 200 in the form of a lower sliding member. For example, the display module 100 may include a panel protection layer PPL, a display panel PNL, a window member WD, a window protection layer WPL. The lower structure 200 may include a plate PT, a flat bar FB, segmental members SM, a support plate SP, and guide members GM.

As described above, the display device 10 may include the first area A1 and the second area A2. As the display device 10 includes the first area A1 and the second area A2, components (e.g., the display module 100 and the lower structure 200, and the like) included in the display device 10 may also include the first area A1 and the second area A2.

A first portion of the display module 100 overlapping the first area A1 may be exposed to the outside and may have a flat shape. A second portion of the display module 100 overlapping the second area A2 may be flexible and may be a changeable shape. The second portion may extend in the first direction D1 from the first portion. The second portion may be exposed to the outside or accommodated inside as the display device 10 is slid. In case that the second portion is exposed to the outside, the second portion may have a flat shape. In case that the second portion is accommodated inside, the second portion may have a curved shape.

The display panel PNL may display an image. The display panel PNL may include sub-pixels emitting light. For example, the display panel PNL may include an organic light emitting display panel, an inorganic light emitting display panel, a quantum dot display panel, a micro LED display panel, a nano LED display panel, a plasma display panel, a field emission display panel, a cathode ray display panel, and a liquid crystal display panel, or an electrophoretic display panel.

The panel protection layer PPL may be disposed under the display panel PNL. The panel protection layer PPL may reduce stress applied to the display panel PNL in case that the display panel PNL is folded or bent. For example, the panel protection layer PPL may prevent impurities and moisture from penetrating into the display panel PNL and may absorb external impact.

The panel protection layer PPL may include a plastic film. For example, the plastic film, which are used for the panel protection layer PPL, may include polyimide (PI), polycarbonate (PC), polypropylene (PP), polyethylene terephthalate (PET), polyethersulfone (PES), methyl methacrylate (PMMA), triacetyl cellulose (TAC), cyclo olefin polymer (COP), and the like. These may be used alone or in combination with each other.

The window member WD may be disposed on the display panel PNL. The window member WD may protect the display panel PNL from external impact. The window member WD may include a transparent material. For example, the window member WD may include glass or plastic.

The window protection layer WPL may be disposed on the window member WD. The window protective layer WPL may prevent the window member WD from being damaged by an external impact. The window protection layer WPL may include a transparent polymer film. For example, the transparent polymer film, which are used for the window protective layer WPL, may include polyethylene terephthalate (PET), polyethylene naphthalate (PEN), polyethersulfone (PES), polyimide (PI), and polyarylate (PAR), polymethyl methacrylate (PMMA), cyclo olefin polymer (COP), polycarbonate (PC), and the like. These may be used alone or in combination with each other.

Each of the display panel PNL, the panel protection layer PPL, the window member WD, and the window protection layer WPL may have a flexible property. Accordingly, each of the display panel PNL, the panel protection layer PPL, the window member WD, and the window protection layer WPL may be repeatedly bent or unfolded.

The plate PT may be disposed under the display module 100. For example, the plate PT may include a metal material. The plate PT may include a first plate PT1 and a second plate PT2. The first plate PT1 may overlap the first area A1, and the second plate PT2 may overlap the second area A2.

The first plate PT1 may have relatively high rigidity. Accordingly, the first plate PT1 may support the display module 100 in the first area A1. In an embodiment, the first plate PT1 may have a substantially flat upper surface.

The second plate PT2 may extend from the first plate PT1 in the first direction D1. The first direction D1 may be a direction parallel to the first plate PT1. The second plate PT2 may have a relatively flexible property as compared to the first plate PT1. The second plate PT2 may be exposed to the outside or accommodated inside as the display device 10 is slid. In an embodiment, openings OP spaced apart from each other in the first direction D1 at regular intervals may be defined in the second plate PT2.

The flat bar FB may be disposed under the first plate PT1. For example, the flat bar FB may contact (e.g., directly contact) the first plate PT1. The flat bar FB may overlap the first area A1. The rigidity of the flat bar FB may be greater than the rigidity of the first plate PT1. Accordingly, the flat bar FB may support the first plate PT1 and the display module 100 in the first area A1. For example, the flat bar FB may include a metal material.

The flat bar FB may have a shape of a flat rectangular parallelepiped with a hollow inside. However, the shape of the flat bar FB is not limited thereto, and the flat bar FB may have various shapes. In another example, the flat bar FB may be omitted.

The segmental members SM may be disposed under the second plate PT2. The segmental members SM may overlap the second area A2. The segmental members SM may be spaced apart from each other in the first direction D1. Each of the segmental members SM may extend in the second direction D2 perpendicular to the first direction D1.

Each of the segmental members SM may contact (e.g., directly contact) the second plate PT2. For example, the segmental members SM may not overlap the openings OP. The segmental members SM may guide a portion of the display module 100 overlapping the second area A2 to move with maintaining a smooth shape that is not deformed convexly.

The flat bar FB and each of the segmental members SM may have the same thickness. In another example, the thickness of the flat bar FB may be different from the thickness of each of the segmental members SM. For example, the thickness of the flat bar FB may be smaller than the thickness of each of the segmental members SM.

The window protective layer WPL, the window member WD, the display panel PNL, the panel protective layer PPL, the plate PT, the flat bar FB and the segmental members SM may be attached to each other through an adhesive layer. However, embodiments are not limited thereto, and the adhesive layer may be omitted.

The support plate SP may be disposed under the flat bar FB and the segmental members SM. For example, the support plate SP may overlap a center portion of the second area A2. The center portion of the second area A2 may extend in the first direction D1.

The support plate SP may be movable under the flat bar FB and the segmental members SM. For example, the support plate SP may slide and move in the first direction D1 or in a direction opposite to the first direction D1. For example, the support plate SP may slide and move between the first area A1 and the second area A2. In case that the display device 10 is slid, the support plate SP may prevent the segmental members SM from sagging or bending.

Referring to FIG. 8, the support plate SP may partially overlap the second area A2 in case that the display device 10 is slid and unfolded. Referring to FIG. 7, the support plate SP may partially overlap the first area A1 and partially overlap the second area A2 in case that the display device 10 is slid and wound. In case that the support plate SP is positioned in the first area A1, the support plate SP may partially overlap the second area A2.

For example, the support plate SP may include a metal material. In another example, the support plate SP may include plastic. However, embodiments are not limited thereto, and the support plate SP may include other materials.

The guide members GM may be disposed under the segmental members SM. The guide members GM may overlap the second area A2. For example, each of the guide members GM may overlap the center portion extending in the first direction D1 of the second area A2.

The guide members GM may be spaced apart from each other in the first direction D1. Each of the guide members GM may overlap each of the segmental members SM. In an embodiment, the guide members GM may overlap the support plate SP in the second direction D2.

A width of each of the guide members GM in the first direction D1 may be smaller than a width of each of the segmental members SM in the first direction D1. However, embodiments are not limited thereto.

End portions (e.g., opposite end portions) of each of the guide members GM may have a protruding shape in a cross-section. In an embodiment, each of the guide members GM may have an omega ($\Omega$) shape in the cross-section. However, embodiments are not limited thereto, and each of the guide members GM may have various shapes in the cross-section.

For example, each of the guide members GM may include a metal material. In another example, each of the guide members GM may include plastic. However, embodiments are not limited thereto, and each of the guide members GM may include other materials.

A pair of rails R may be disposed between the segmental members SM and the support plate SP. The pair of rails R may overlap the second area A2. The pair of rails R may extend in the first direction D1. The pair of rails R may contact (e.g., directly contact) the support plate SP and the guide members GM. For example, one rail R of the pair of rails R may contact (e.g., directly contact) a first end portion of each of the guide members GM, and the other rail R of the pair of rails R may contact (e.g., directly contact) a second end portion of each of the guide members GM. The pair of rails R may guide a sliding path of the display device 10 by the guide members GM.

The guide members GM may be movable under the segmental members SM. For example, the guide members GM may slide and move in the first direction D1 or in a direction opposite to the first direction D1 through the pair of rails R. The sliding movement of the display device 10 may be guided by the sliding movement of the guide members GM through the pair of rails R. Lifting of the segmental members SM may be prevented by sliding the guide members GM on the pair of rails R.

Figure 5:
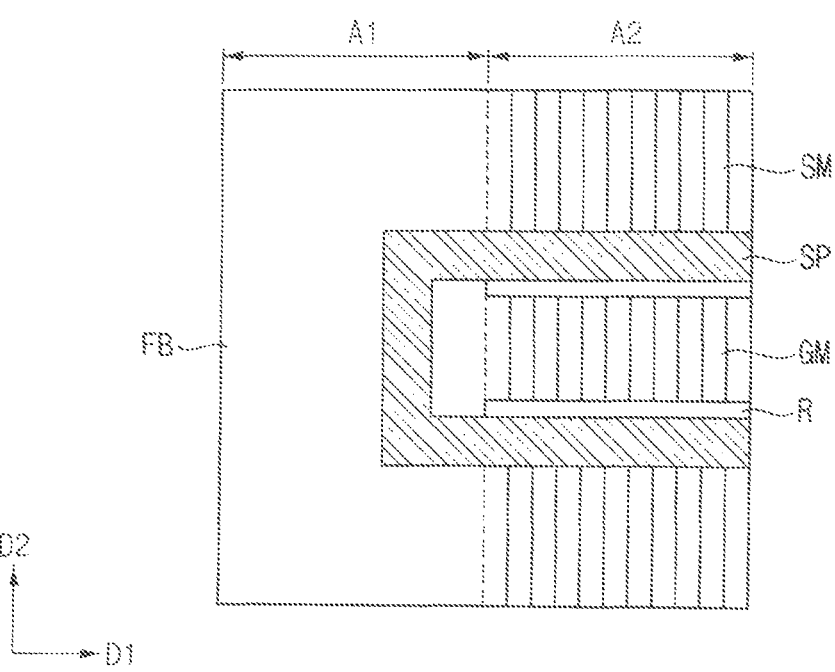
FIG. 5 is a schematic rear view illustrating an example of a lower structure of FIGS. 2, 3, and 4.
Figure 6:
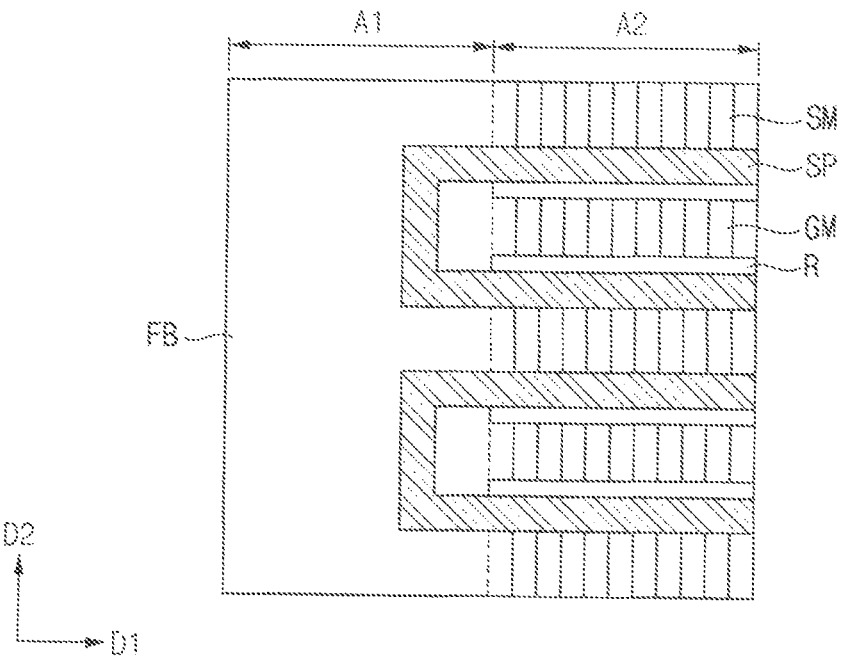
FIG. 6 is a schematic rear view illustrating another example of a lower structure of FIGS. 2, 3, and 4.

FIG. 5 is a schematic rear view illustrating an example of a lower structure of FIGS. 2, 3, and 4. FIG. 6 is a schematic rear view illustrating another example of a lower structure of FIGS. 2, 3, and 4.

Referring to FIGS. 5 and 6, the support plate SP may have a "C" shape or a "⊏" shape in a plan view. For example, the support plate SP may have a rectangular shape with one side opening in a plan view. However, embodiments are not limited thereto, and the support plate SP may have various planar shapes.

Referring to FIG. 5, one support plate SP may be provided. In another example, referring to FIG. 6, two support plates SP may be provided. In this case, the guide members GM may include first guide members corresponding to a support plate SP and second guide members corresponding to another support plate SP. However, embodiments are not limited thereto, and the number of support plates SP may be three or more. For example, support plates SP may be plural. In case that the support plates SP is plural, the support plates SP may be spaced apart from each other in the second direction D2 perpendicular to the first direction D1.

For example, the display device 10 may include the display module 100 including the first area A1 and the second area A2, which is positioned adjacent to the first area A1 and is curved to have a constant curvature, and the lower structure 200 including the plate PT, the segmental members SM, and the guide members GM. For example, the plate PT may include the first plate PT1 disposed under the display module 100 and overlapping the first area A1 and the second plate PT2 disposed under the display module 100 and overlapping the second area A2 and extending from the first plate PT1. The segmental members SM may be disposed under the plate PT and may overlap the second area A2. The guide members GM may overlap the segmental members SM in the second area A2 and may be movable under the segmental members SM. Accordingly, lifting of the segmental members SM due to the guide members GM may be prevented in case that the display device 10 is slid.

The display device 10 according to an embodiment may further include the support plate SP movable under the segmental members SM. Accordingly, in case that the display device 10 is slid, the segmental members SM may be prevented from sagging or bending due to the support plate SP.

Therefore, in case that the display device 10 is slid, deformation of the display device 10 (e.g., occurrence of creases in the display device 10) due to the guide members GM and the support plate SP may be prevented. As a result, the reliability of the display device 10 may be improved.

FIG. 7 is a schematic cross-sectional view taken along line IV-IV' of FIG. 1. FIG. 8 is a schematic cross-sectional view illustrating the display device of FIG. 7 in an unfolded state (or flat state). For example, FIGS. 7 and 8 are schematic cross-sectional views for explaining a sliding method of the display device 10 of FIG. 1.

Referring to FIGS. 7 and 8, the display device 10 according to an embodiment may further include a roller RL.

The roller RL may be positioned at an end portion of the display device 10. The roller RL may rotate in a clockwise direction or a counterclockwise direction. In case that the roller RL rotates in a clockwise direction or a counterclockwise direction, the display device may be wound or unfolded.

In an area adjacent to the roller RL, a portion of the display device 10 may be curved to have a constant curvature. For example, in the area adjacent to the roller RL, a portion of the display module 100 may be curved to have a certain curvature. In this case, a portion of the second plate PT2 overlapping the portion of the display module 100 may be curved to have a constant curvature.

In case that the roller RL rotates in a counterclockwise direction, the display device may slide in an unfolding direction (e.g., the first direction D1) (see FIG. 7). In case that the display device 10 is slid in the unfolding direction, the second area A2 may be unfolded from the roller RL. In case that the second area A2 is spread from the roller RL, the display area of the display device 10 that is visible to the outside may be expanded (see FIG. 8).

In case that the roller RL rotates in a clockwise direction, the display device 10 may slide in a winding direction (e.g., a direction opposite to the first direction D1) (see FIG. 8). In case that the display device 10 is slid in the winding direction, the second area A2 may be internally wound from the roller RL. As the second area A2 is internally wound from the roller RL, the display area of the display device 10 that is visible to the outside may be reduced (see FIG. 7).

Accordingly, the display area of the display device 10 that is visible to the outside according to the sliding state of the display device 10 may be implemented, and portability of the display device 10 may be improved.

Figure 9:
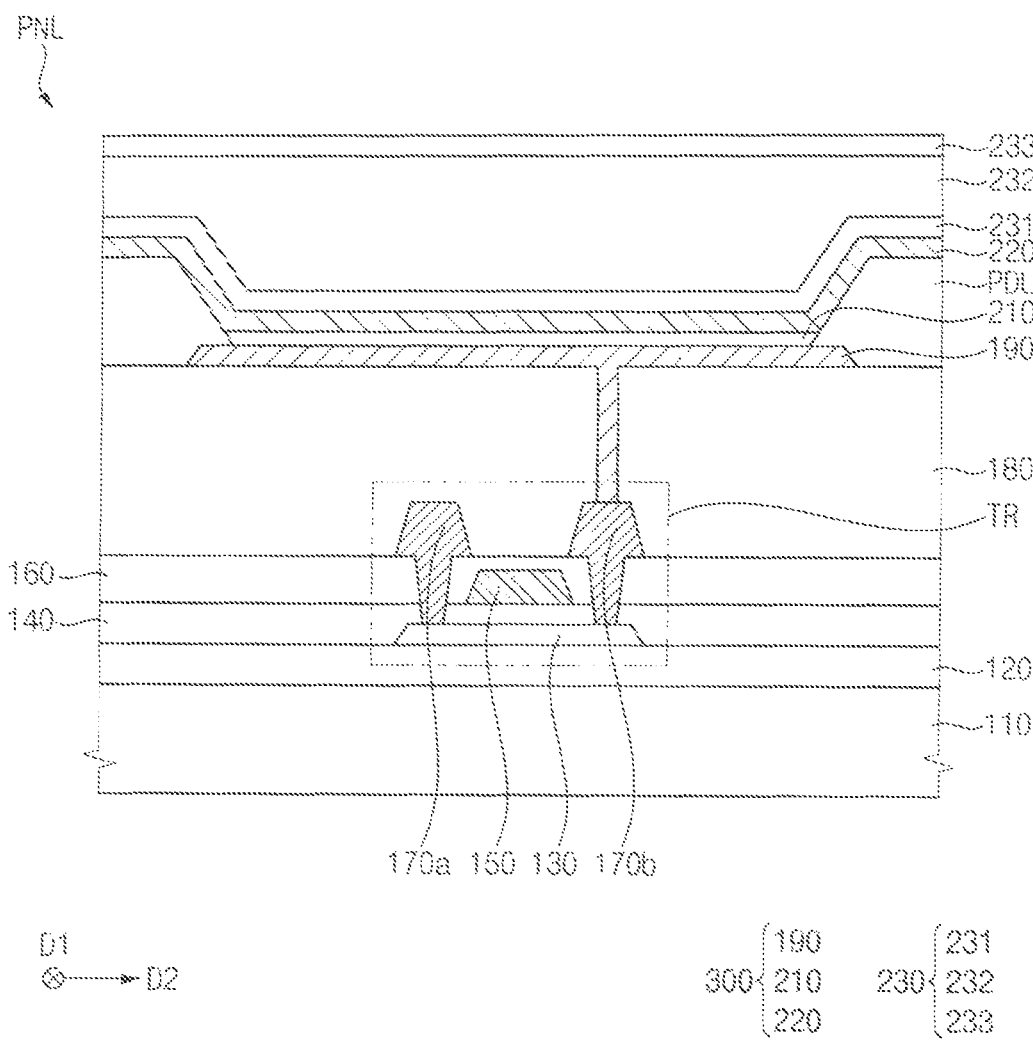
FIG. 9 is a schematic enlarged cross-sectional view of the display panel of FIG. 1.

FIG. 9 is a schematic enlarged cross-sectional view of the display panel of FIG. 1.

Referring to FIG. 9, the display panel PNL may include a substrate 110, a buffer layer 120, a gate insulating layer 140, an interlayer insulating layer 160, a transistor TR, a planarization layer 180, a pixel defining layer PDL, a light emitting element 300 and the encapsulation layer 230.

For example, the transistor TR may include an active layer 130, a gate electrode 150, a source electrode 170a, and a drain electrode 170b. The light emitting element 300 may include a lower electrode 190, a light emitting layer 210, and an upper electrode 220. For example, the encapsulation layer 230 may include a first inorganic encapsulation layer 231, an organic encapsulation layer 232, and a second inorganic encapsulation layer 233.

The substrate 110 may include a transparent material or an opaque material. The substrate 110 may include a flexible transparent resin substrate. For example, the transparent resin substrate, which is used as the substrate 110, may include a polyimide substrate. In another example, the substrate 110 may include a quartz substrate, a synthetic quartz substrate, a calcium fluoride substrate, a soda lime glass substrate, an alkali-free glass substrate, and the like. These may be used alone or in combination with each other.

The buffer layer 120 may be disposed on the substrate 110. The buffer layer 120 may prevent diffusion of metal atoms or impurities from the substrate 110 into the transistor TR. For example, the buffer layer 120 may include an inorganic material such as oxide or nitride.

The active layer 130 may be disposed on the buffer layer 120. The active layer 130 may include a metal oxide semiconductor, an inorganic semiconductor (e.g., amorphous silicon, poly silicon), or an organic semiconductor. The active layer 130 may include a source region and a drain region, and a channel region positioned between the source region and the drain region.

The gate insulating layer 140 may be disposed on the buffer layer 120. The gate insulating layer 140 may cover the active layer 130 on the substrate 110 and may have a substantially flat upper surface without forming a step difference around the active layer 130. In another example, the gate insulating layer 140 may cover the active layer 130 on the substrate 110 and may be disposed along the profile (or outline) of the active layer 130 with a uniform thickness.

For example, the gate insulating layer 140 may include an inorganic material such as silicon oxide ($SiO_x$), silicon nitride ($SiN_x$), silicon carbide ($SiC_x$), silicon oxynitride ($SiO_xN_y$), silicon oxycarbide ($SiO_xC_y$), and the like. These may be used alone or in combination with each other.

The gate electrode 150 may be disposed on the gate insulating layer 140. The gate electrode 150 may overlap the channel region of the active layer 130. For example, the gate electrode 150 may include a metal, an alloy, a metal nitride, a conductive metal oxide, a transparent conductive material, and the like. These may be used alone or in combination with each other.

The interlayer insulating layer 160 may be disposed on the gate insulating layer 140. The interlayer insulating layer 160 may cover the gate electrode 150 on the substrate 110 and may have a substantially flat upper surface without forming a step difference around the gate electrode 150. In another example, the interlayer insulating layer 160 may cover the gate electrode 150 on the substrate 110 and may be disposed along the profile of the gate electrode 150 with a uniform thickness.

For example, the interlayer insulating layer 160 may include an inorganic material such as silicon oxide, silicon nitride, silicon carbide, silicon oxynitride, silicon oxycarbide, and the like. These may be used alone or in combination with each other.

The source electrode 170a and the drain electrode 170b may be disposed on the interlayer insulating layer 160. The source electrode 170a may be connected to the source region of the active layer 130 through a contact hole formed by removing a first portion of the gate insulating layer 140 and the interlayer insulating layer 160. The drain electrode 170b may be connected to the drain region of the active layer 130 through a contact hole formed by removing a second portion of the gate insulating layer 140 and the interlayer insulating layer 160. For example, each of the source electrode 170a and the drain electrode 170b may include a metal, an alloy, a metal nitride, a conductive metal oxide, a transparent conductive material, and the like. These may be used alone or in combination with each other.

Accordingly, the transistor TR including the active layer 130, the gate electrode 150, the source electrode 170a and the drain electrode 170b may be disposed on the substrate 110.

The planarization layer 180 may be disposed on the interlayer insulating layer 160. The planarization layer 180 may cover the source electrode 170a and the drain electrode 170b. The planarization layer 180 may include an organic material or an inorganic material. For example, the planarization layer 180 may include an organic material such as polyimide-based resin, photoresist, polyacryl-based resin, polyamide-based resin, siloxane-based resin, and the like. These may be used alone or in combination with each other.

The lower electrode 190 may be disposed on the planarization layer 180. The lower electrode 190 may be connected to the drain electrode 170b through a contact hole formed by removing a portion of the planarization layer 180. For example, the lower electrode 190 may include a metal, an alloy, a metal nitride, a conductive metal oxide, a transparent conductive material, and the like. These may be used alone or in combination with each other.

The pixel defining layer PDL may be disposed on the planarization layer 180. The pixel defining layer PDL may include an opening exposing a portion of the lower electrode 190. The pixel defining layer PDL may include an organic material or an inorganic material. For example, the pixel defining layer PDL may include an organic material such as polyimide.

The light emitting layer 210 may be disposed on the lower electrode 190. For example, the light emitting layer 210 may be disposed within the opening of the lower electrode 190. The light emitting layer 210 may be formed using at least one of light emitting materials that emit different color lights (e.g., red light, green light, blue light, and the like) according to sub-pixels. In another example, the light emitting layer 210 may emit white light as a whole by stacking light emitting materials that generate different color lights such as red light, green light, and blue light.

The upper electrode 220 may be disposed on the pixel defining layer PDL and the light emitting layer 210. For example, the upper electrode 220 may include a metal, an alloy, a metal nitride, a conductive metal oxide, a transparent conductive material, and the like. These may be used alone or in combination with each other.

Accordingly, the light emitting element 300, which includes the lower electrode 190, the light emitting layer 210 and the upper electrode 220, may be disposed on the substrate 110.

The first inorganic encapsulation layer 231 may be disposed on the upper electrode 220. The first inorganic encapsulation layer 231 may prevent the light emitting layer 210 from being deteriorated due to penetration of moisture, oxygen, and the like. For example, the first inorganic encapsulation layer 231 may also perform a function of protecting the display panel PNL from external impact. The first inorganic encapsulation layer 231 may include inorganic materials having flexibility.

The organic encapsulation layer 232 may be disposed on the first inorganic encapsulation layer 231. The organic encapsulation layer 232 may improve flatness of the display panel PNL and may protect the display panel PNL. The organic encapsulation layer 232 may include flexible organic materials.

The second inorganic encapsulation layer 233 may be disposed on the organic encapsulation layer 232. The second inorganic encapsulation layer 233 together with the first inorganic encapsulation layer 231 may prevent the light emitting layer 210 from being deteriorated due to penetration of moisture, oxygen, and the like. For example, the second inorganic encapsulation layer 233 may protect the display panel PNL together with the first inorganic encapsulation layer 231 and the organic encapsulation layer 232 from external impact. The second inorganic encapsulation layer 233 may include inorganic materials having flexibility.

Figure 10:
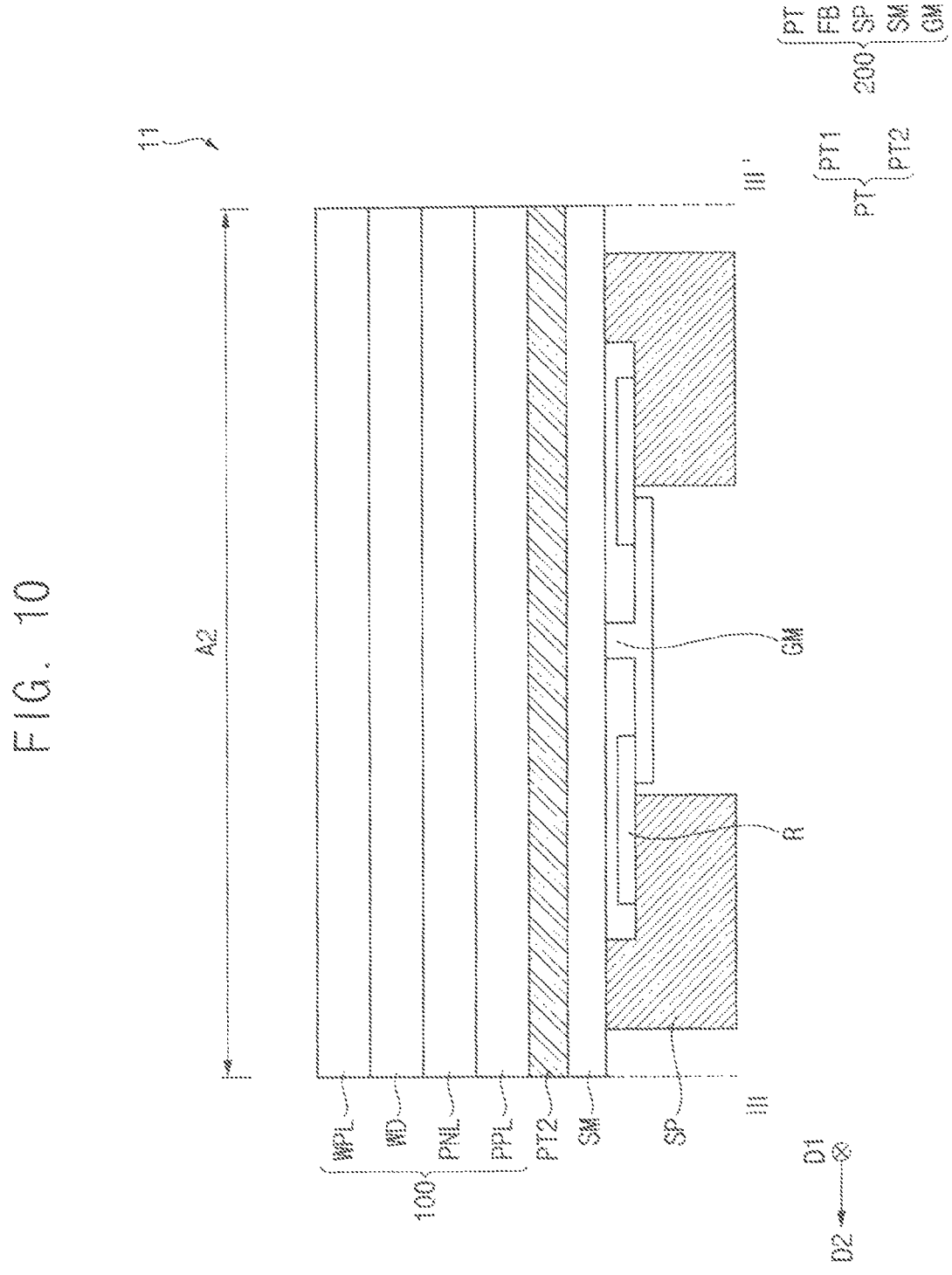
FIG. 10 is a schematic cross-sectional view illustrating a display device according to an embodiment.
Figure 11:
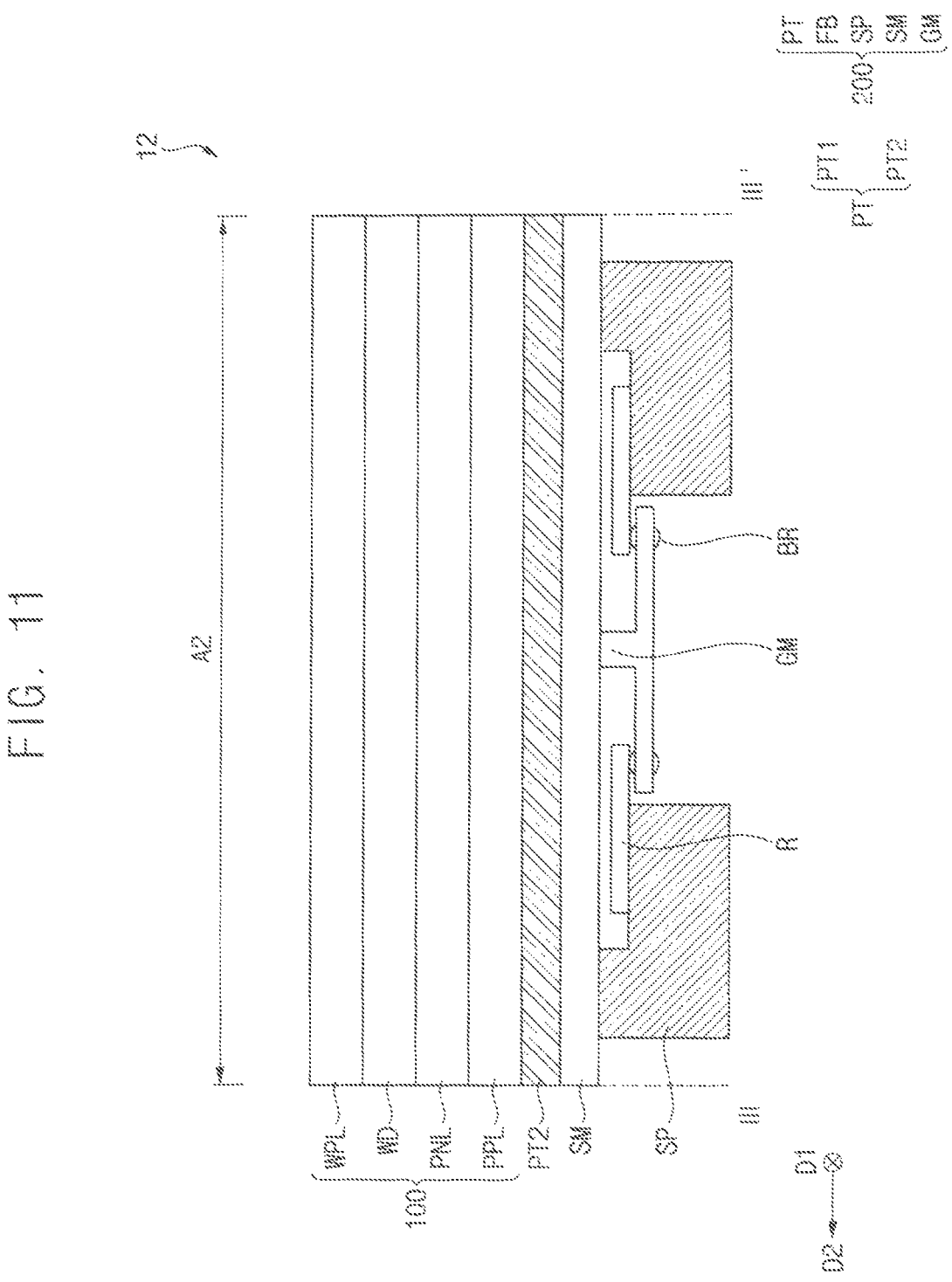
FIG. 11 is a schematic cross-sectional view illustrating a display device according to an embodiment.

FIG. 10 is a schematic cross-sectional view illustrating a display device according to an embodiment. FIG. 11 is a schematic cross-sectional view illustrating a display device according to an embodiment.

Hereinafter, in the display devices 11 and 12 described with reference to FIGS. 10 and 11, descriptions of components substantially the same as or similar to components of the display device 10 described with reference to FIGS. 2, 3, and 4 will be omitted or simplified for descriptive convenience.

Referring to FIG. 10, end portions (e.g., opposite end portions) of the guide member GM may be formed in a protruding shape in the cross-section. In an embodiment, the guide member GM may have a T-shape in the cross-section. However, embodiments are not limited thereto, and the guide member GM may have various shapes in the cross-section.

Referring to FIG. 11, the display device 12 according to an embodiment may further include a bearing BR. The bearing BR may be disposed between the guide members GM. For example, the bearing BR may contact (e.g., directly contact) the rail R.

For example, the bearing BR may have a circular shape in the cross-section. The bearing BR may reduce friction generated in case that the guide members GM is slid and move through the rail R.

For example, the bearing BR may include stainless steel (SUS). However, embodiments are not limited thereto, and the bearing BR may include various materials.

Figure 12:
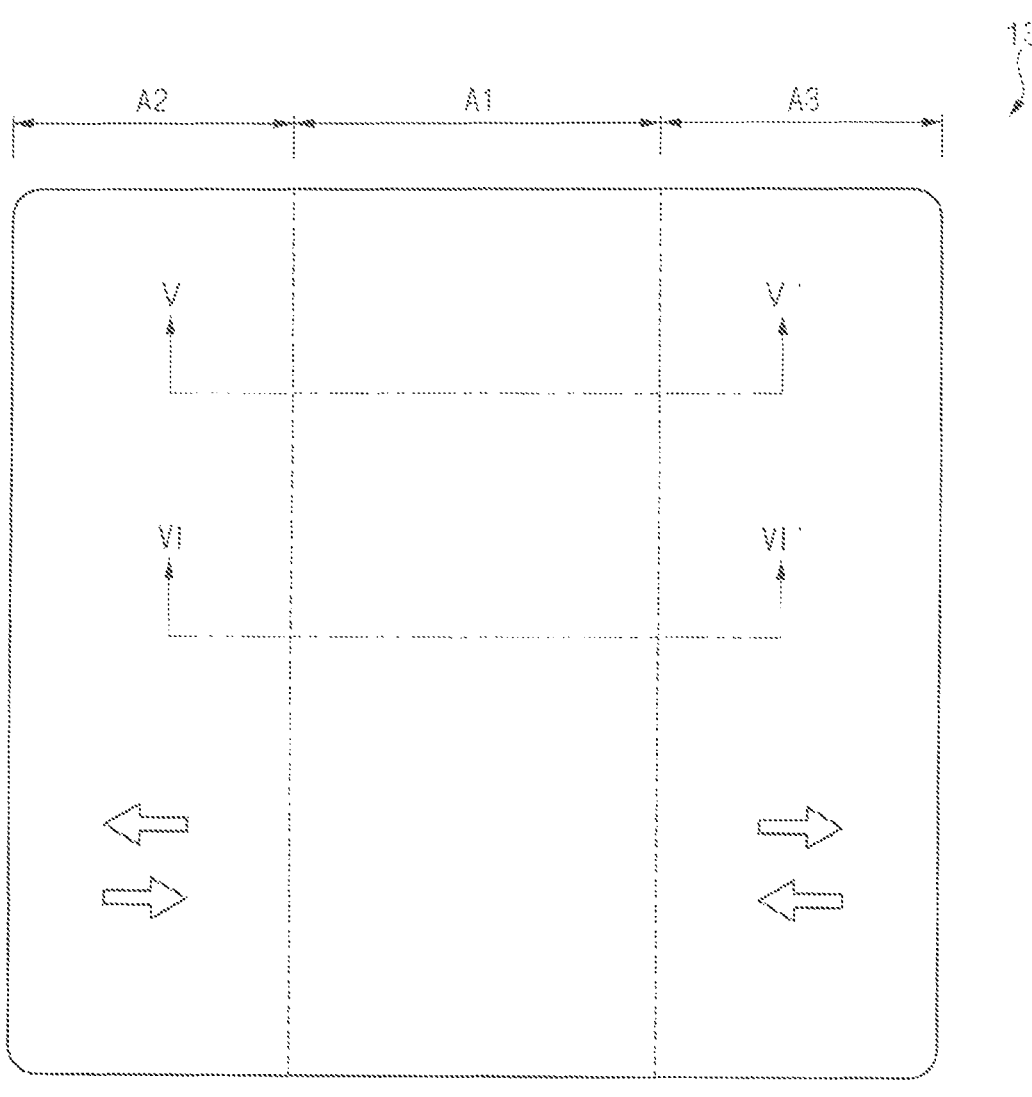
FIG. 12 is a schematic cross-sectional view illustrating a display device according to an embodiment.
Figure 12:
Figure 13:
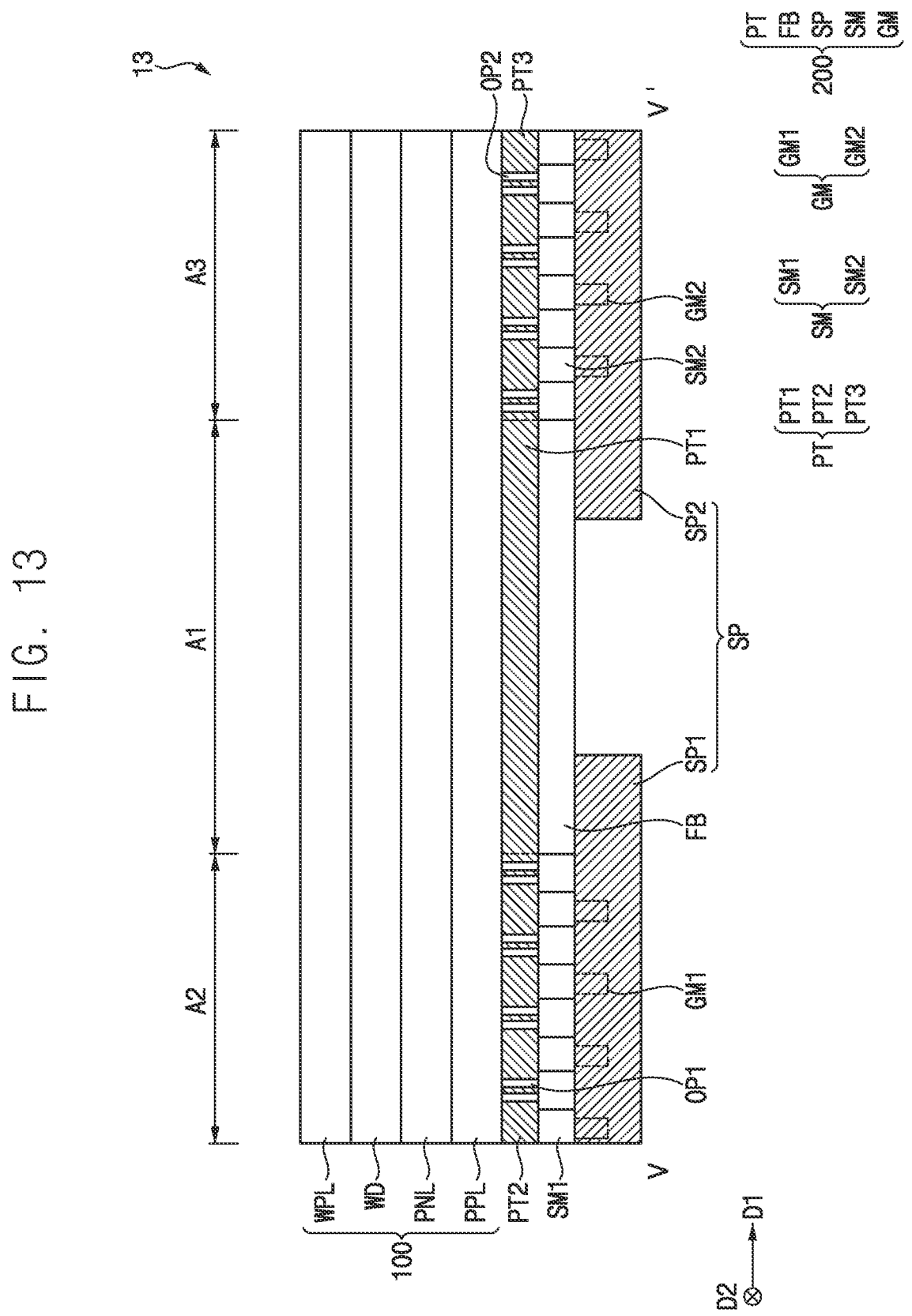
FIG. 13 is a schematic cross-sectional view taken along line V-V of FIG. 12.

FIG. 12 is a schematic cross-sectional view illustrating a display device according to an embodiment. FIG. 13 is a cross-sectional view taken along line V-V of FIG. 12. FIG. 14 is a schematic cross-sectional view taken along line VI-VI' of FIG. 12.

Hereinafter, in the display device 13 described with reference to FIGS. 12, 13, and 14, descriptions of components substantially the same as or similar to components of the display device 10 described with reference to FIG. 1 will be omitted or simplified for descriptive convenience.

Referring to FIG. 12, the display device 13 according to an embodiment may include a first area A1, a second area A2, and a third area A3. The second area A2 may be positioned adjacent to the first area A1, and the third area A3 may be positioned adjacent to the first area A1. For example, the first area A1 may be positioned between the second area A2 and the third area A3.

Each of the first area A1, the second area A2, and the third area A3 may be a display area that displays an image. However, embodiments are not limited thereto, and each of the first area A1, second area A2, and third area A3 may partially display an image.

The first area A1 may be an area exposed to the outside and may have a flat shape. Each of the second area A2 and the third area A3 may be flexible, and may be exposed to the outside or accommodated as the display device 10 is slid. Each of the second area A2 and the third area A3 may have a flat shape in case that each of the second area A2 and the third area A3 is exposed to the outside, and may have a curved shape in case that each of the second area A2 and the third area A3 is accommodated inside.

The second area A2 may be positioned adjacent to a first side of the first area A1, and the third area A3 may be positioned adjacent to a second side of the first area A1. The second side may face the first side. However, embodiments are not limited thereto.

In case that the display device 13 is slid, the area (or size) of each of the second area A2 and the third area A3 may change. In case that the display device 13 is slid and unfolded, the area (or size) of each of the second area A2 and the third area A3 may increase. In case that the display device 13 is slid and wound, the area (or size) of each of the second area A2 and the third area A3 may decrease. The areas (or sizes) of the second area A2 and the third area A3 may vary independently of each other. For example, in case that the area (or size) of the second area A2 increases or decreases, the area (or size) of the third area A3 may be constant. In case that the area (or size) of the third area A3 increases or decreases, the area (or size) of the second area A2 may be substantially constant.

Referring to FIGS. 13 and 14, the display device 13 according to an embodiment may include a display module 100 and a lower structure 200 in the form of a lower sliding member. The display module 100 may include a panel protection layer PPL, a display panel PNL, a window member WD, and a window protection layer WPL. The lower structure 200 may include a plate PT, a flat bar FB, segmental members SM, a support plate SP, and guide members GM.

The display module 100 may include a first part, a second portion and a third portion. The first portion may overlap the first area A1. The first portion may be a portion exposed to the outside and may have a flat shape.

The second portion may overlap the second area A2, and the third portion may overlap the third area A3. Each of the second portion and the third portion may be flexible. The second portion may extend from the first portion in a direction opposite to the first direction D1, and the third portion may extend from the first portion in the first direction D1. Each of the second and third parts may be exposed to the outside or accommodated inside as the display device 13 is slid. Each of the second portion and the third portion may have a flat shape in case that each of the second portion and the third portion is exposed to the outside. Each of the second portion and the third portion may have a curved shape in case that each of the second portion and the third portion is accommodated inside.

The plate PT may be disposed under the display module 100. In an embodiment, the plate PT may include a first plate PT1, a second plate PT2, and a third plate PT3. The first plate PT1 may overlap the first area A1, the second plate PT2 may overlap the second area A2, and the third plate PT3 may overlap the third area A3.

The second plate PT2 may extend from the first plate PT1 in a direction opposite to the first direction D1, and the third plate PT3 may extend from the first plate PT1 in the first direction D1. Each of the second plate PT2 and the third plate PT3 may be more flexible than the first plate PT1. In an embodiment, first openings OP1 spaced apart from each other in the first direction D1 at substantially regular intervals (or substantially constant distances) may be defined in the second plate PT2, and second openings OP2 spaced apart in the first direction D1 at substantially regular intervals (or substantially constant distances) may be defined in the third plate PT3.

Each of the second plate PT2 and the third plate PT3 may be exposed to the outside or accommodated inside as the display device 10 is slid.

The flat bar FB may be disposed under the first plate PT1. For example, the flat bar FB may contact (e.g., directly contact) the first plate PT1. The flat bar FB may overlap the first area A1. The flat bar FB may have a flat rectangular parallelepiped shape with a hollow inside. However, the shape of the flat bar FB is not limited thereto, and the flat bar FB may have various shapes. In another example, the flat bar FB may be omitted.

The segmental members SM may include first segmental members SM1 and second segmental members SM2. The first segmental members SM1 may be disposed under the second plate PT2, and the second segmental members SM2 may be disposed under the third plate PT3. The first segmental members SM1 may overlap the second area A2, and the second segmental members SM2 may overlap the third area A3.

The first segmental members SM1 may be spaced apart from each other in the first direction D1, and the second segmental members SM2 may be spaced apart from each other in the first direction D1. Each of the first segmental members SM1 may contact (e.g., directly contact) the second plate PT2, and each of the second segmental members SM2 may contact (e.g., directly contact) the third plate PT3. For example, the first segmental members SM1 and the second segmental members SM2 may not overlap the openings OP1 and OP2. The segmental members SM may guide the second portion of the display module 100 overlapping the second area A2 and the third portion of the display module 100 overlapping the third area A3 to move with maintaining a smooth shape that is not deformed convexly.

The support plate SP may be disposed under the flat bar FB and the segmental members SM. In an embodiment, the support plate SP may include a first support plate SP1 and a second support plate SP2.

Each of the first support plate SP1 and the second support plate SP2 may be movable under the flat bar FB and the segmental members SM. For example, each of the first and second support plates SP1 and SP2 may slide and move in the first direction D1 or in a direction opposite to the first direction D1. For example, the first support plate SP1 may slide and move between the first area A1 and the second area A2, and the second support plate SP2 may slide and move between the first area A1 and the third area A3. In case that the display device 10 is slid, the first support plate SP1 may prevent the first segmental members SM1 from sagging or bending, and the second support plate SP2 may prevent the second segmental members SM2 from sagging or bending.

In case that the display device 13 is slid and unfolded, the first support plate SP1 may partially overlap the second area A2 and the second support plate SP2 may partially overlap the third area A3. In case that the display device 13 is slid and wound, the first support plate SP1 may partially overlap each of the first area A1 and the second area A2, and the second support plate SP2 may partially overlap each of the first area A1 and the third area A3.

The guide members GM may be disposed under the segmental members SM. In an embodiment, the guide members GM may include first guide members GM1 and second guide members GM2. The first guide members GM1 may overlap the second area A2, and the second guide members GM2 may overlap the third area A3.

The first guide members GM1 may be spaced apart from each other in the first direction D1, and the second guide members GM2 may be spaced apart from each other in the first direction D1. Each of the first guide members GM1 may overlap each of the first segmental members SM1, and each of the second guide members GM2 may overlap each of the second segmental members SM2. For example, a width of each of the first guide members GM1 in the first direction D1 may be smaller than a width of each of the first segmental members SM1 in the first direction D1, and a width of each of the second segmental members SM2 in the first direction D1 may be smaller than a width of each of the second segmental members SM2 in the first direction D1.

The first guide members GM1 may overlap the first support plate SP1 in the second direction D2. For example, the second guide members GM2 may overlap the second support plate SP2 in the second direction D2.

The first guide members GM1 may slide and move in the first direction D1 or in a direction opposite to the first direction D1 through a first pair of rails disposed between the first support plate SP1 and the first segmental members SM1. For example, the second guide members GM2 may slide and move in the first direction D1 or in the direction opposite to the first direction D1 through a second pair of rails disposed between the second support plate SP2 and the second segmental members SM2. Lifting of the first segmental members SM1 may be prevented by sliding the first guide members GM1 on the first pair of rails. For example, lifting of the second segmental members SM2 may be prevented by sliding the second guide members GM2 on the second pair of rails.

The embodiments may be applied to various display devices. For example, the embodiments may be applicable to various display devices such as display devices for vehicles, ships and aircraft, portable communication devices, display devices for exhibition or information transmission, medical display devices, and the like.

In concluding the detailed description, those skilled in the art will appreciate that many variations and modifications may be made to the embodiments without substantially departing from the principles and spirit and scope of the disclosure. Therefore, the disclosed embodiments are used in a generic and descriptive sense only and not for purposes of limitation.

What is claimed is:

1. A display device comprising:
    a display module including a first area and a second area positioned adjacent to the first area, the second area including a portion curved to have a substantially constant curvature;
    a plate including:
        a first plate disposed under the display module and overlapping the first area; and
        a second plate disposed under the display module and overlapping the second area, the second plate extending from the first plate;
    segmental members disposed under the plate and overlapping the second area; and
    guide members overlapping the segmental members in the second area and movable under the segmental members; and
    a support plate disposed under the segmental members and movable under the segmental members, wherein
    the second plate includes a plurality of through holes spaced apart from each other by substantially constant distances.

2. The display device of claim 1, wherein end portions of each of the guide members have a protruding shape in a cross-section.

3. The display device of claim 1, wherein each of the guide members has an omega (Ω) shape or a T shape in a cross-section.

4. The display device of claim 1, wherein the support plate has a rectangular shape with a side opening in a plan view.

5. The display device of claim 1, wherein the support plate is plural.

6. The display device of claim 1, wherein the support plate partially overlaps the second area in case that the support plate is positioned in the first area.

7. The display device of claim 1, wherein the segmental members are spaced apart from each other in a first direction, and each of the segmental members extends in a second direction perpendicular to the first direction.

8. The display device of claim 7, wherein the support plate overlaps the guide members in the second direction.

9. The display device of claim 7, wherein the guide members are spaced apart from each other in the first direction.

10. The display device of claim 1, further comprising:

a pair of rails disposed between the segmental members and the support plate, and directly contacting each of the support plate and the guide members.

11. The display device of claim 10, wherein the guide members are spaced apart from each other in a direction, and each of the pair of rails extend in the direction.

12. The display device of claim 10, further comprising:

a bearing disposed between the guide members and directly contacting the pair of rails.

13. The display device of claim 12, wherein the bearing has a circular shape in a cross-section.

14. The display device of claim 12, wherein the bearing includes stainless steel (SUS).

15. The display device of claim 1, wherein a width of each of the guide members is smaller than a width of each of the segmental members.

16. The display device of claim 1, wherein the segmental members directly contact the second plate and do not overlap the plurality of openings, neighboring ones of the segmental members are spaced apart from each other, and the segmental members do not overlap any of the plurality of the through holes in a thickness direction of the display device.

17. A display device comprising:

a display module including a first area and a second area positioned adjacent to the first area in a first direction, the second area including a portion curved to have a substantially constant curvature;

a plate including:

a first plate disposed under the display module and overlapping the first area; and a second plate disposed under the display module and overlapping the second area, the second plate extending from the first plate;

a flat bar disposed under the first plate and overlapping the first area;

segmental members disposed under the second plate and overlapping the second area;

guide members overlapping the segmental members in the second area and movable in the first direction under the segmental members; and support plate disposed under the segmental members and movable in the first direction under the segmental members, wherein the second plate is perforated by a plurality of through holes to produce flexibility.

18. The display device of claim 17, wherein each of the guide members has an omega ($\Omega$) shape or a T shape in a cross-section, the second plate has lower rigidity than the first plate, and the first plate being absent of any through holes.

19. The display device of claim 17, wherein the support plate has a rectangular shape with a side opening in a plan view.

20. The display device of claim 17, wherein the support plate include a plurality of support plates, and the plurality of support plates are spaced apart from each other in a second direction perpendicular to the first direction.

21. The display device of claim 17, wherein the segmental members are spaced apart from each other in the first direction, and each of the segmental members extends in a second direction perpendicular to the first direction.

22. The display device of claim 21, wherein the support plate overlaps the guide members in the second direction.

* * * * *